(12) United States Patent
Takahashi et al.

(10) Patent No.: US 6,482,747 B1
(45) Date of Patent: Nov. 19, 2002

(54) PLASMA TREATMENT METHOD AND PLASMA TREATMENT APPARATUS

(75) Inventors: Kazue Takahashi, Kudamatsu; Saburo Kanai, Hikari; Yoshiaki Satou, Tokuyama; Takazumi Ishizu, Hikari, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/218,038

(22) Filed: Dec. 22, 1998

(30) Foreign Application Priority Data

Dec. 26, 1997 (JP) .............................. 9-359971

(51) Int. Cl.[7] .......................................... H01L 21/3065
(52) U.S. Cl. ...................... 438/715; 438/718; 438/719; 438/737; 438/742
(58) Field of Search ............................ 216/67; 438/714, 438/715, 718, 719, 735, 737, 742

(56) References Cited

U.S. PATENT DOCUMENTS 5,474,650 A * 12/1995 Kumihashi et al. ............ 216/67
5,846,375 A * 12/1998 Gilchrist et al. ............. 156/345

FOREIGN PATENT DOCUMENTS

| JP | 61-10238 | * 1/1986 |
| JP | 7-18438 | 1/1995 |

* cited by examiner

Primary Examiner—Thi Dang
(74) Attorney, Agent, or Firm—Antonelli, Terry, Stout & Kraus, LLP

(57) ABSTRACT

Plasma treatment apparatus and method in which an influence on the treatment characteristics of reaction products in plasma treatment such as etching is offset, thereby enabling uniform treatment characteristics to be obtained in the plane of a substrate are provided. In a plasma treatment method of treating a substrate to be processed by using a gas plasma via a mask in a treatment chamber, plasma treatment is performed while optimizing an amount of deposition of a side wall protection layer, equalizing the optimized deposition amount in the center of the substrate and that in a peripheral part, and maintaining the uniformity in the plane of the side wall protection layer.

19 Claims, 11 Drawing Sheets

PLASMA TREATMENT METHOD AND PLASMA TREATMENT APPARATUS

BACKGROUND OF THE INVENTION

1. Field of the Invention

The present invention relates to plasma treatment for performing etching or the like on a substrate to be treated; and, more particularly, invention relates to a plasma treatment method and plasma treatment apparatus in which the treatment characteristics in the central part of the substrate and those in the peripheral part of the substrate to be treated are uniformized.

2. Related Background Art

Various methods have been devised for conventional plasma treatment apparatuses in order to uniformize the plasma density (ion current value) and ion energy (RF bias voltage) in the plane of a substrate (wafer) and to uniformize the substrate temperature. For example, the publication of Japanese unexamined patent No. 7-18438 discloses a technique for uniformizing the temperature distribution in the substrate by forming roughness on the surface of an insulating material on a substrate supporting face of a flat electrode, changing the density or depth of the rough surface of the insulating material, and distributing the electrostatic adsorption.

As the substrate size increases and the etching size becomes finer, however, the influence of the distribution of etching reaction products in the central part and those in the peripheral part of a substrate becomes tangible.

Figure 15:
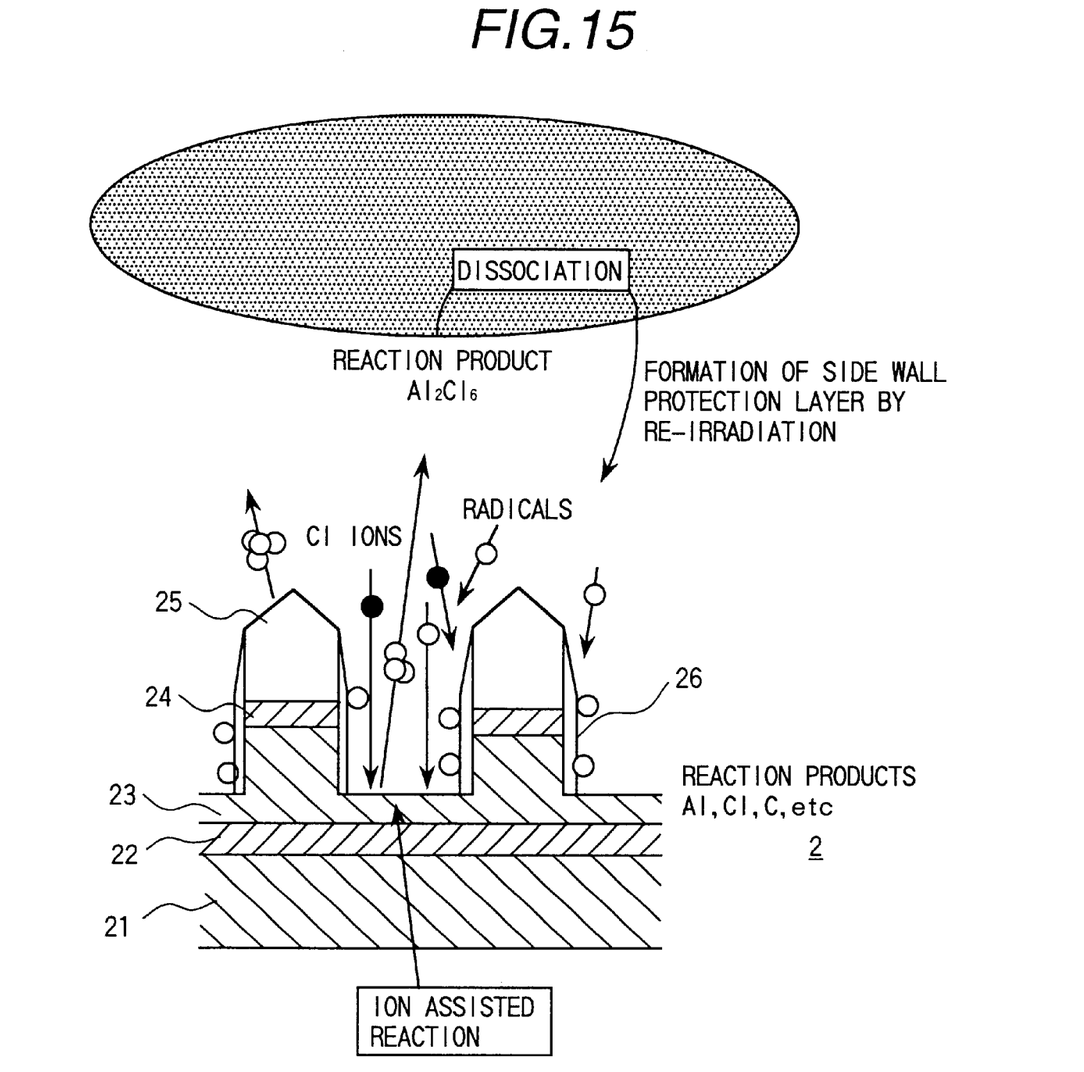
FIG. 15 is a diagram for explaining the behavior of etching reaction products at the time of plasma etching in a conventional technique.

FIG. 15 is a diagram for explaining the behavior of etching reaction products. As shown in the diagram, etching reaction products such as Al, Cl, C, and the like react with a plasma etching gas (ions and radicals) on a substrate (wafer) 2 to be treated, evaporate in a vapor phase, and become $Al_2Cl_6$ or the like. The reaction products show complicated behavior such that they are directed again at the substrate 2 to be treated or they are dissociated again in the plasma and the dissociated species are directed at the substrate 2. That is, etched Al on the bottom of the substrate is released as reaction products into a vapor phase and a part of them is dissociated again in the plasma and is again directed at the substrate 2. A photo resist 25 is likewise etched so that the substrate is again irradiated with the reaction products of the resist. Electrically neutral species among the species dissociated from the reaction products in the plasma are directed also at the side walls of an area to be etched and are deposited. Such species, species which are obtained by etching the bottom face and directly deposited on the side walls, species directed at the side walls sputtered by the incident ions including physical or chemical elements, and the like are deposited, thereby forming a side wall protection layer 26.

Figure 16:
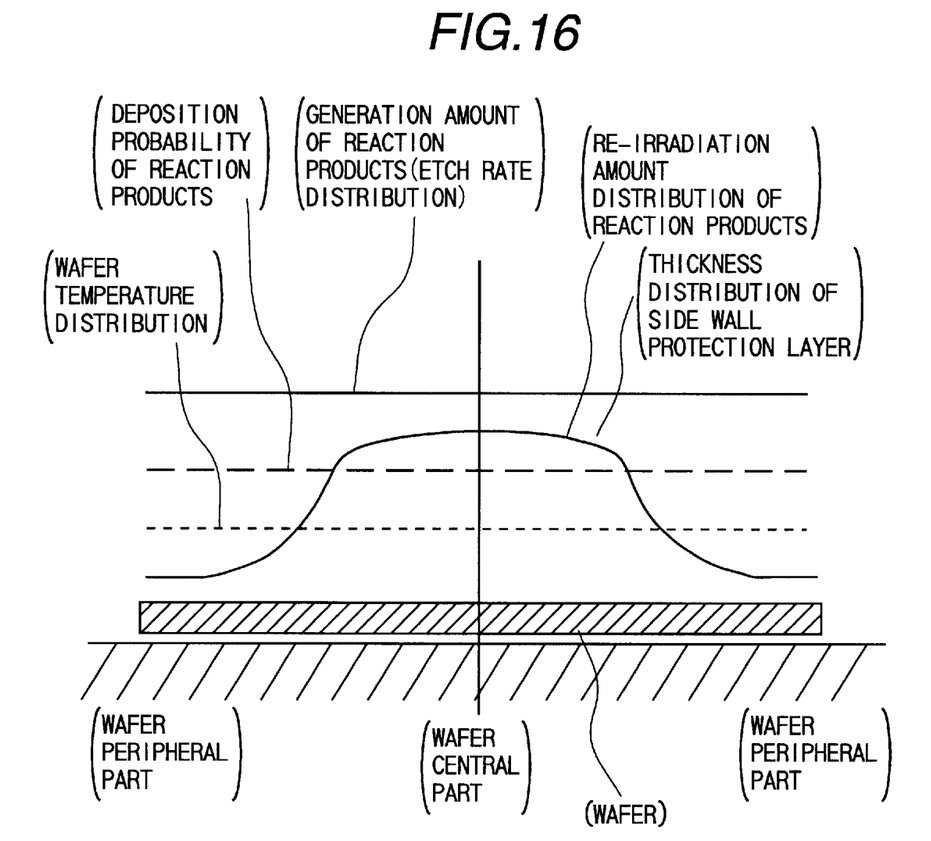
FIG. 16 is a diagram showing the relation among substrate temperature, and generation amount and re-irradiation distribution of reaction products at the time of the plasma etching in the conventional technique.

Among them, with respect to the re-irradiation of the reaction products, non-uniformity of an irradiation amount in the plane of the substrate tends to occur by the following reason. The reaction products obtained by etching and released into a vapor phase are exhausted as a gas from the etching chamber. The outer the position of the substrate is, the more the reaction products are exhausted efficiently. As shown in FIG. 16, therefore, in the density distribution of the reaction products in the vapor phase, that is, the re-irradiation amount distribution of the reaction products, inevitably, the density or the re-irradiation amount is high in the central part of the substrate and is low in a peripheral part.

As mentioned above, in a peripheral part of the substrate, the amount of the reaction products is smaller than that in the central part of the substrate since they are exhausted together with an etching gas. In case of metal etching, if the side wall protection layer is thick, the etch rate on the side walls by the ion assisted reaction becomes low. Because of this, when describing a process for a trench as an example, the shape of a part to be etched becomes a so-called tapered shape in which the width is reduced as the etch depth increases. On the contrary, when the side wall protection layer is too thin, the side walls are etched and the part to be etched becomes wider than a target width. Consequently, in order to obtain a vertical shape as an etched part, the amount of deposition of the side wall protection layer has to be optimized so as to obtain a proper thickness and prevent the side walls from becoming fat or thin.

On the other hand, with reduction in the etching size, the need for the processing accuracy of dimensions increases. For example, when about $1/10$ of a design dimension is a permissible level, the permissible level is $\pm 0.05$ μm for the design dimension of 0.5 μm. With reduction in the dimension to 0.25 μm and 0.13 μm, the permissible levels become $\pm 0.025$ μm and $\pm 0.013$ μm, respectively. In order to achieve such a required specification, factors exerting an influence on the processing dimension have to be made clear and controlled.

With the reduction in the etching size, also in dense and sparse patterns in which fine patterns and sparse patterns which are not so dense mixedly exist, the need for the processing accuracy of dimensions has been increasing.

SUMMARY OF THE INVENTION

It is an object of the present invention to provide plasma treatment method and apparatus in which an influence on treatment characteristics of reaction products in a plasma treatment such as etching is offset and uniform treatment characteristics can be obtained in the plane of a substrate.

It is another object of the present invention to provide plasma treatment method and apparatus which improves the uniformity in the substrate plane of a shape to be processed in consideration of influences of reaction products at the time of plasma treatment such as etching.

It is further another object of the present invention to provide a plasma treatment method and a plasma treatment apparatus which can obtain an etching treatment characteristic such that there is no variation in processing dimension in dense and sparse patterns.

According to a feature of the invention, in a plasma treatment method of performing etch treatment to a substrate to be processed by using a gas plasma via a mask in a treatment chamber, plasma treatment is performed while maintaining the in-plane uniformity of a side wall protection layer formed on the side walls of a part to be etched in the substrate.

According to another feature of the invention, in a plasma treatment method of treating a substrate to be processed by using a gas plasma via a mask in a treatment chamber, plasma treatment is performed while equalizing an amount of deposition of a side wall protection layer formed on the substrate to be processed in the center of the substrate and that in an end part of the substrate, and maintaining the in-plane uniformity of the side wall protection layer.

According to further another feature of the invention, in a plasma treatment method of treating a substrate to be processed with a gas plasma by using a resist as a mask in a treatment chamber, plasma treatment is performed to the substrate while maintaining the uniformity of a deposition amount of reaction products which are generated by a reaction between the substrate to be processed and the plasma and are directed at and deposited on the substrate in the plane of the substrate to be processed, thereby forming a side wall protection layer having a uniform plane on the substrate.

According to another feature of the invention, in a plasma treatment method of performing plasma treatment to a substrate to be processed with a gas plasma by using a resist as a mask in a treatment chamber, the plasma treatment is performed while maintaining the in-plane uniformity of a side wall protection layer formed on the substrate by controlling the temperature of the substrate.

It is another feature of the invention that the plasma treatment is performed to the substrate to be processed while adjusting the pressure, flow rate, and mixing ratio of a process gas in the treatment chamber.

It is another feature of the invention that the plasma treatment is performed to the substrate to be processed while regulating an exhaust amount of the reaction products from the treatment chamber.

It is another feature of the invention that the plasma treatment is performed to the substrate to be processed while adjusting the kind of the process gas or the pressure of the process gas in the treatment chamber.

It is another feature of the invention that variation in a deposition amount of reaction products in the plane of the substrate to be processed is maintained within ±10%.

It is another feature of the invention that the diameter of the substrate to be processed is 200 mm or larger and a pattern formed on the substrate to be processed is 0.35 $\mu$m or smaller.

According to another feature of the invention, in a plasma treatment apparatus for treating a substrate to be processed by using a gas plasma, a substrate holding electrode on which the substrate to be processed is placed and which controls the temperature of the substrate so that temperatures in the central and peripheral parts of the substrate are different Ad and has a function of maintaining in-plane uniformity of a deposition amount of reaction products in the plane of the substrate.

In case of etching, usually, it is requested to perform etching vertically and faithfully to the processing dimension via a mask. In this case, etching in the direction vertical to the etching direction, that is, etching of the side walls exerts an influence on the processing dimension. In the etching of the side walls, when the etch pressure is high, injected ions also contribute to the etching. When the etch pressure is sufficiently low, the ion injection can be almost ignored. In such a state where the ion injection can be almost ignored, the etching of the side walls largely depends on a chemical reaction between the side walls and radicals. The chemical reaction depends on the temperature and the density and kind of radicals irradiated and deposited. In case of etching, reaction products which suppress the chemical reaction are deposited on the side walls. It can be said that the amount of the deposition, that is, the thickness of the side wall protection layer decides the side wall etch rate. In other words, the control of the thickness of the side wall protection layer is the key to improve the processing accuracy.

Consequently, in the etching of the finer pattern on which the influence of the reaction products is large, especially, it is necessary to consider distribution characteristics such that the reaction products in the vapor phase are not uniform in the plane of the substrate and the amount of the reaction products is smaller in the peripheral part of the substrate, and to obtain a plasma distribution and a substrate temperature distribution which make the in-plane distribution of the side wall protection layer uniform by offsetting the influence.

According to the invention, in a plasma treatment method of treating a substrate to be processed with a gas plasma via a mask in a treatment chamber, the substrate is subjected to plasma treatment while maintaining the in-plane uniformity of the side wall protection layer formed on the substrate. By maintaining the in-plane uniformity of the side wall protection layer on the substrate to be processed, etch rate of the side walls by an ion assisted reaction becomes uniform. Even in case of a fine pattern, a vertical shape of the etched part can be easily obtained.

In order to maintain the in-plane uniformity of the side wall protection layer formed on the substrate to be processed, for example, the temperature distribution in the substrate plane is controlled. The higher the substrate temperature is, the lower the probability that the reaction products which are directed again at the substrate are deposited on the side walls of the part to be etched or the like is. That is, when the substrate temperature is constant, the deposition probability of the reaction products in the plane of the substrate becomes constant. Consequently, the amount of deposition on the side walls of the treated part, that is, the thickness of the side wall protection layer is proportional to the re-irradiation amount of the reaction products. As a result, the deposition amount of reaction products on the substrate increases in the center of the substrate and the shape of the treated part and that of a peripheral part become different.

In order to solve the problem and maintain the in-plane uniformity of the side wall protection layer on the substrate to be processed, at the time of the plasma treatment, for example, it is controlled so that the temperature in the center of the substrate is higher as compared with that in the peripheral part. Since the deposition probability of the reaction products is low when the temperature in the center of the substrate is high, even if the re-irradiation amount of the reaction products is large, the amount of reaction products deposited on the side walls of the etched part is therefore small. The temperature of the substrate is regulated to have a characteristic such that the temperatures in and out of the substrate plane are different so that the deposition amount of the reaction products to the side walls in the substrate plane becomes uniform. Thus, the treatment characteristics in the substrate plane can be made uniform.

When the substrate temperature is changed, not only the deposition probability of the reaction products changes but also the deposition probability of the etching gas plasma (especially, radicals) changes. The rate of etch reaction itself also changes. Consequently, since the generation amount of the reaction products changes, it is necessary to control the substrate temperature distribution in accordance with the conditions of plasma treatment such as etching.

For maintaining the uniformity in the plane of the side wall protection layer, there are various methods of controlling the temperature distribution in the substrate plane. For example, the surface of the electrode is divided into a part which comes into contact with the back face of the wafer and a part (trenches) which does not come into contact with the back face, and the in-plane temperature of the wafer can be controlled by utilizing the fact that the overall heat transfer coefficient in the contact part and that in the trenches are different. The overall heat transfer coefficient can be also changed by varying the depth of the trenches.

Further, the overall heat transfer coefficient can be controlled by coating the trench with a film. Further, by adjusting the kind and thickness of the film coated on the trench, the temperature can be changed according to a process. By coating with a film, cleaning can be made easily. The film does not have to be made of plastics but can be made of a metal or ceramics. The film has to be thin. The temperature of the wafer can be also controlled by coating a part which is in contact with the back face of the wafer with the film.

According to the invention, the plasma treatment method and the plasma treatment apparatus in which the influence on the etching characteristics of the reaction products in the plasma treatment is offset and the uniform treatment characteristics can be obtained in the substrate plane can be provided.

DETAILED DESCRIPTION OF PREFERRED EMBODIMENTS

Embodiments of the present invention will be described in detail hereinbelow.

Figure 17:
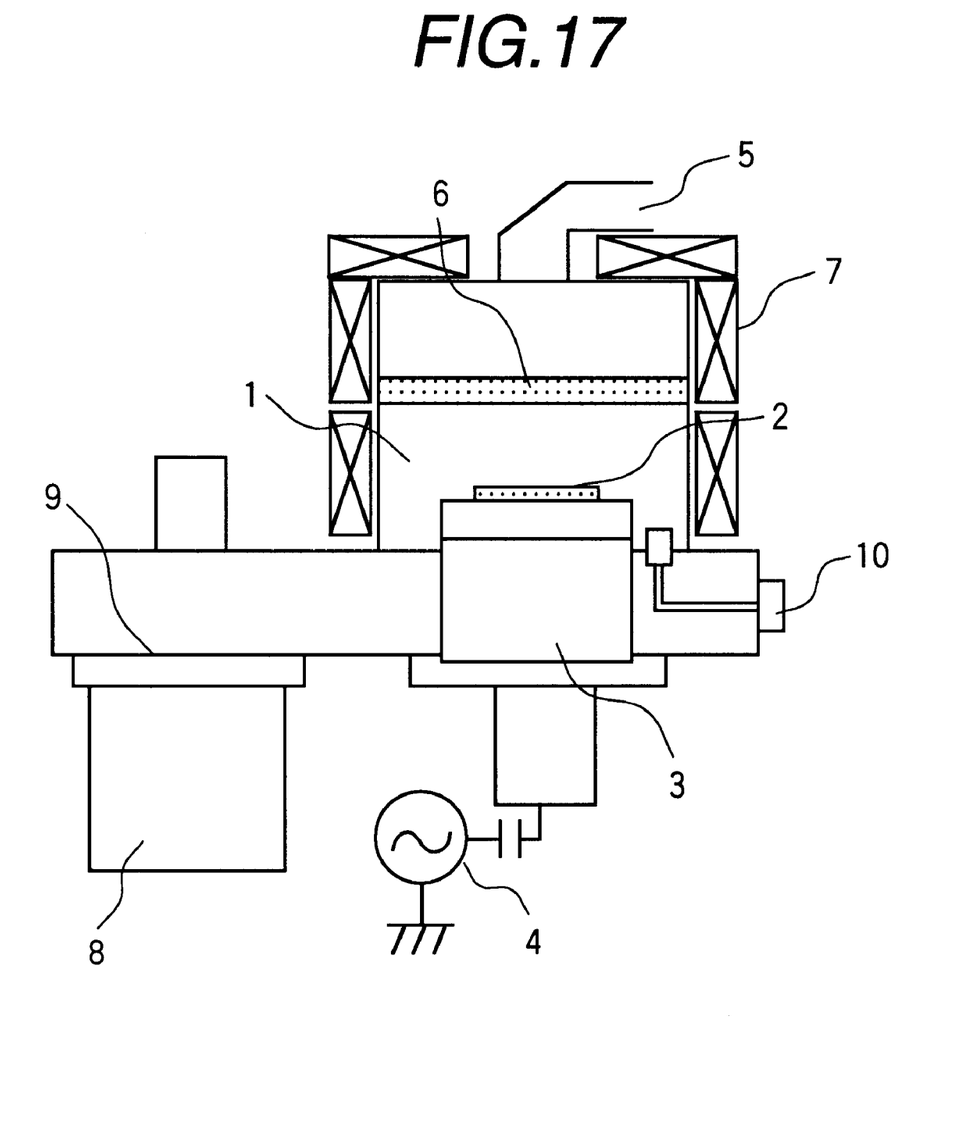
FIG. 17 is a schematic diagram of a plasma etching apparatus to which the invention is applied.

FIG. 17 is a schematic diagram of a plasma treatment apparatus to which the invention is applied. The apparatus of FIG. 17 is an etching apparatus employing a plasma generating method using electron cyclotron resonance by a microwave. The invention can be also applied to apparatuses of other systems as long as it is a plasma treatment apparatus, and is not limited to the apparatus of FIG. 17.

Shown in FIG. 17 are an etching chamber 1; a substrate 2 placed on an electrode 3; an RF generator 4 for applying an RF bias to the substrate; a wave guide 5 for guiding a microwave to the etching chamber 1; a quartz window 6; an electromagnetic coil 7 for forming an electron cyclotron resonance region in the etching chamber by applying a magnetic field to the microwave; a vacuum pump 8; a pressure regulating valve 9; and a sensor 10 such as a pressure sensor.

Figure 2:
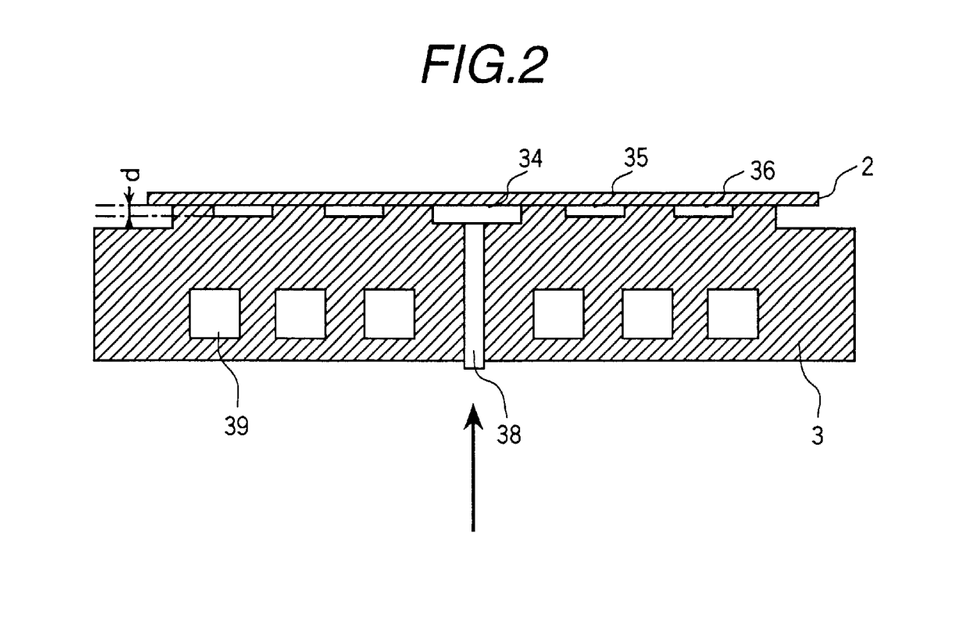
FIG. 2 is a vertical cross section showing the essential part of an electrode in a plasma etching apparatus according to an embodiment of the invention.
Figure 3:
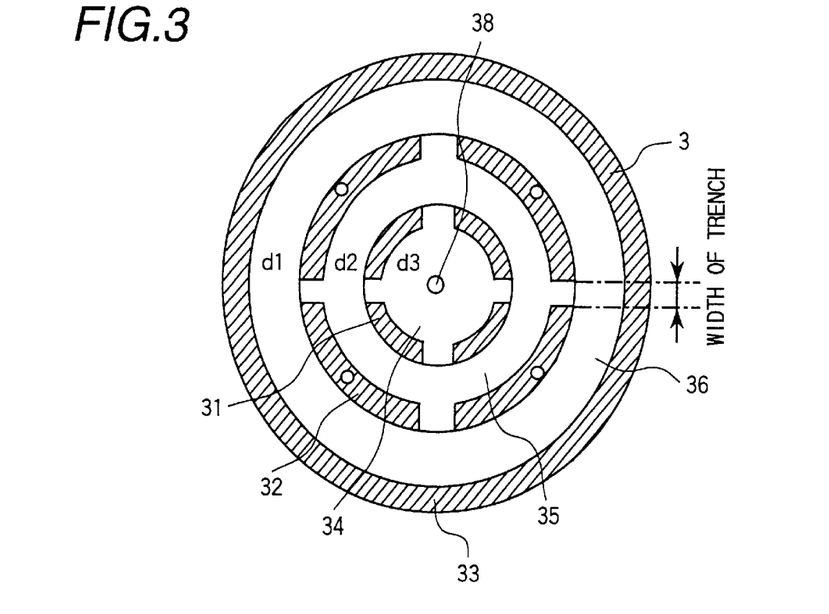
FIG. 3 is a plan view of the essential part of the electrode of FIG. 2.

The electrode 3 is an electrostatic adsorption electrode and a part of the electrode surface serves as an electrostatic adsorption face which is in contact with the back face of the substrate 2. As shown in FIGS. 2 and 3, recessed parts 34, 35, and 36 are formed between annular electrostatic adsorption faces 31, 32, and 33 of the electrostatic adsorption electrode 3. Reference numeral 38 denotes a supply port of a heat transfer gas to the back face of the substrate and 39 indicates a passage of a medium for cooling the electrode. The depth (d) of the recessed parts 34, 35, and 36 becomes smaller from the center to the outer side of the electrostatic adsorption electrode 3 in accordance with the order of d3>d2>d1. In the case where trenches are formed on the electrostatic adsorption face in place of the recessed parts, it is sufficient to decrease the depth from the center to the outer side of the electrostatic adsorption electrode 3.

Figure 1:
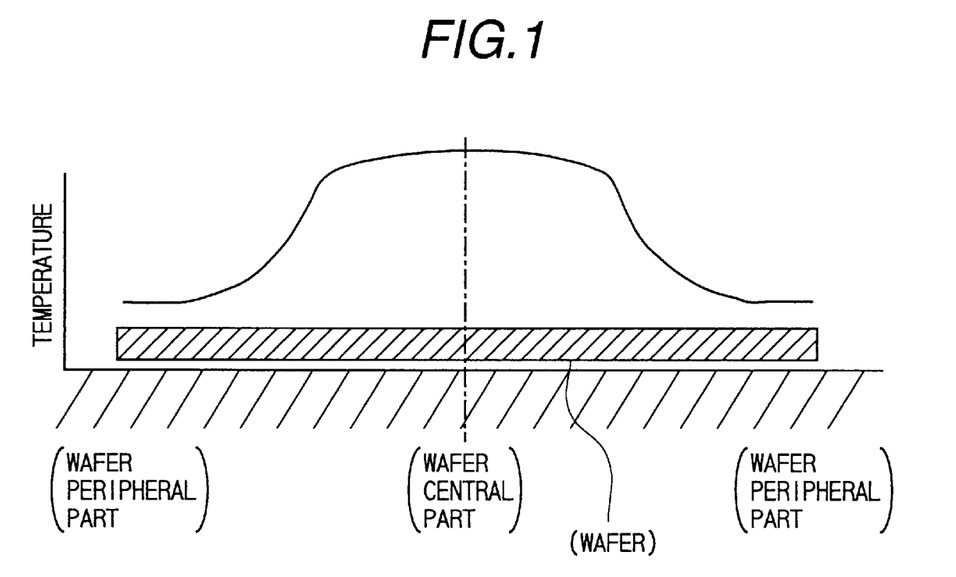
FIG. 1 is a diagram showing an example of control characteristics of an in-plane temperature of a substrate in the invention.

As mentioned above, since the depth (d) of the recessed parts 34, 35, and 36 is decreased from the center to the outer side of the electrostatic adsorption electrode 3, the electrostatic adsorption electrode 3 has the function of maintaining the temperature in the central part of the substrate at the time of etching treatment higher than that in the peripheral part as shown in FIG. 1. When the temperature in the central part of the substrate is high at the time of etching treatment, the deposition probability of the reaction products becomes low. Consequently, even if the amount of re-irradiation of the reaction products is large, the amount of the reaction products deposited on the side walls of the etched part decreases. The difference between the high and low temperatures of the substrate is adjusted so that the deposition amount of the reaction products to the side walls of the etched part is uniform. In this manner, as will be described hereinbelow, the etching characteristics in the substrate plane can be uniformized.

The mechanism of the plasma treatment will be described by etching operation to an aluminium wiring film as an example.

Figure 4:
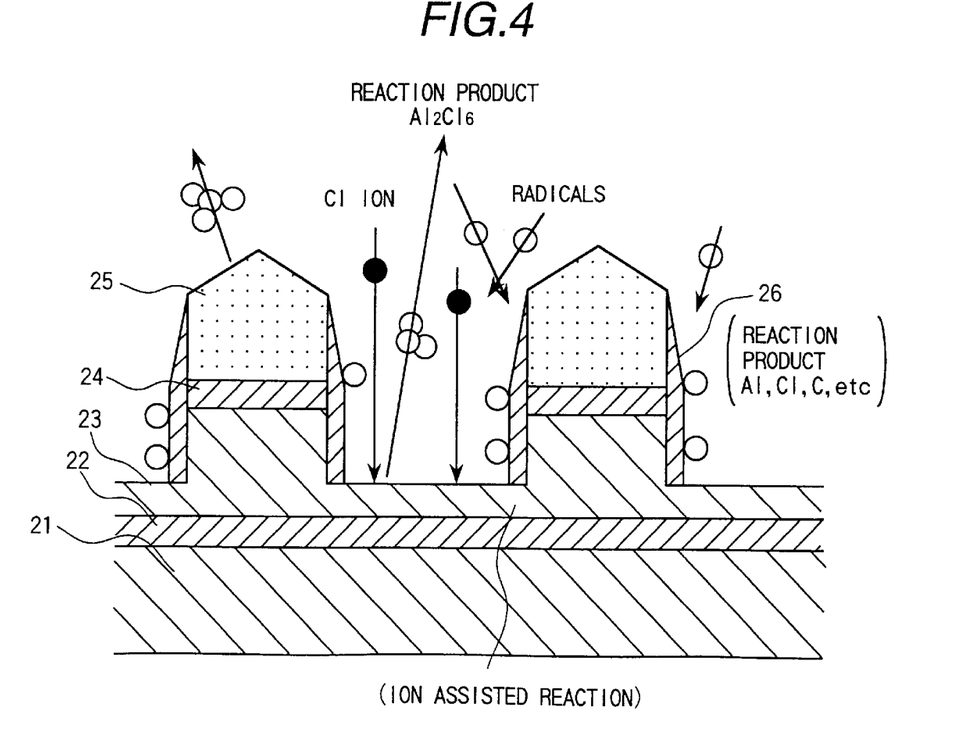
FIG. 4 is a schematic diagram showing a state where an aluminium wiring is being etched according to the method of the invention.

FIG. 4 is a schematic diagram showing that an aluminium wiring film is being etched. As an aluminium wiring, a film 22 for preventing diffusion called a barrier is formed on an SiO$_2$ oxide film 21 as an underlayer. On the film 21, an aluminium wiring film 23 is formed. The barrier 22 is made of Ti or TiN and the aluminium wiring is made of an alloy such as Al—Cu or Al—Si—Cu. The composition ratio of Cu and Si or Cu is usually about 0.5 to 1.5%.

Further, a cap layer 24 made of TiN or the like is formed on the aluminium wiring. The cap layer 24 has thereon a resist 25. Since light reflected directly from the aluminium wiring is too strong when a fine pattern is exposed by lithography, the cap layer 24 is provided as a reflection preventing film for preventing deterioration in the resolution of the exposure.

The aluminium is etched by using chlorine gas. Usually, since it is also necessary to etch a natural oxide film of aluminium, a mixed gas of $BCl_3/Cl_2$ is used. Aluminium and chlorine evaporate as $Al_2Cl_6$. This reaction easily occurs even at an ordinary temperature and progresses even when chlorine gas and aluminium come into contact with each other.

As shown in FIG. 4, therefore, in case of intending to obtain a vertical shape anisotropically by using the resist as a mask, the side walls of the aluminium wiring film have to be prevented from being etched. In the plasma etching, however, since the mixed gas of $BCl_3/Cl_2$ becomes a plasma state, in addition to cl ions and the like, neutral activated species such as Cl radicals are generated. Since the neutral activated species are not influenced by the electric field or the magnetic field, they flit about in random directions in the etching chamber and a number of them are directed at the side walls. Consequently, the reaction between the Cl radicals and the aluminium side walls has to be prevented. A side wall protection layer 26 functions to prevent it.

Although the Cl radicals and Al react with each other, in order to obtain a vertical shape and to perform etching at higher speed, an RF bias is applied by the RF generator 4 to the substrate 2, thereby allowing ions to be directed vertically at the substrate. The ions are accelerated by the RF bias, become a high energy state, and are directed at the etching bottom of the aluminium wiring film. By the ion irradiation, Cl adsorbed on the etching bottom promptly reacts with Al. Etching in which the ion kinetic energy is transformed to the reaction between Cl and Al on the etching bottom is called ion assisted etching.

The aluminium etched on the bottom is released as reaction products into the vapor phase. A part of the reaction products dissociates again in the plasma and is again directed at the substrate. Since the resist is likewise etched, the substrate is also irradiated with the reaction products of the resist. Electrically neutral species among species which are obtained by dissociation of those reaction products in the plasma are directed also at the side walls of the etched part. Such species, species obtained by etching the bottom face and directly deposited on the side walls, species directed at the side walls sputtered by the incident ions including physical or chemical elements, and the like are deposited, thereby forming the side wall protection layer. Among them, due to the re-irradiation of the reaction products, non-uniformity in the plane of the substrate easily occurs by the following reason. The reaction products released into the vapor phase by the etching are exhausted as a gas from the etching chamber. As described with reference to FIG. 16, the reaction products on the outer periphery of the substrate are more efficiently exhausted. When the substrate temperature distribution is uniform in the plane, inevitably, the density distribution of the reaction products in the vapor phase is higher over the center of the substrate and is lower in the peripheral part.

Figure 5:
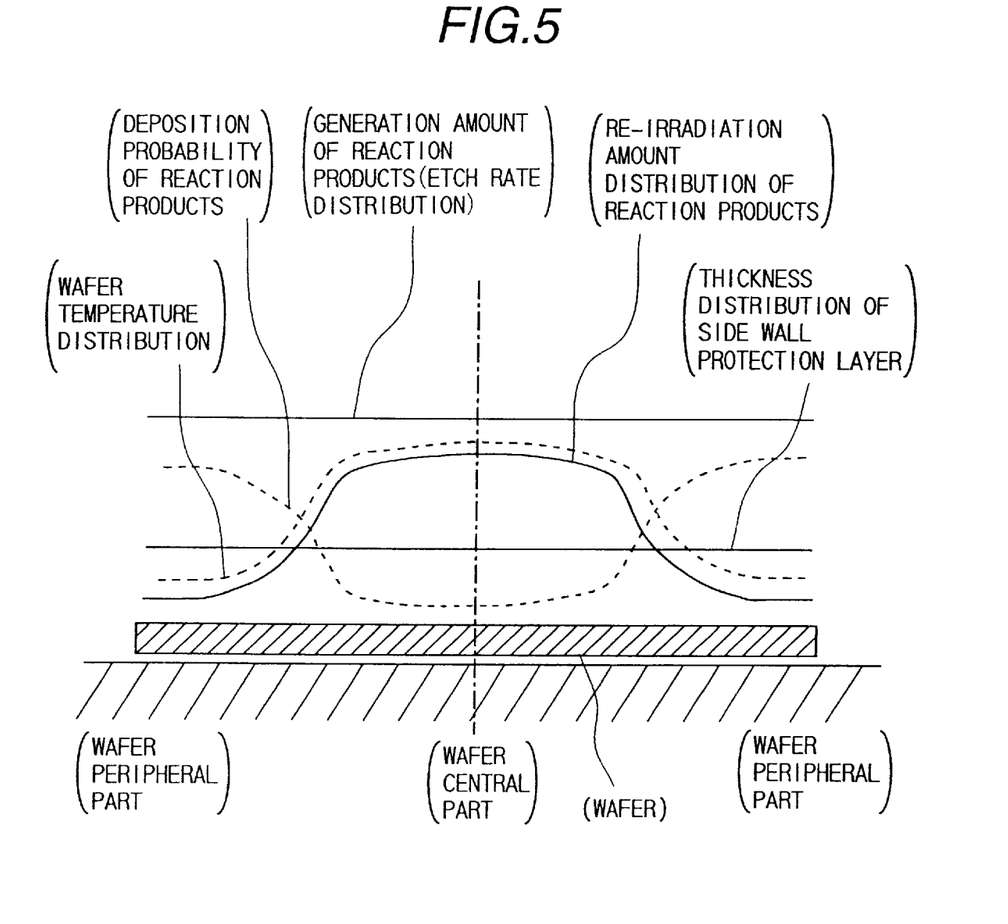
FIG. 5 is a diagram showing the relation among substrate temperature, and generation amount and re-irradiation distribution of reaction products at the time of plasma etching in the invention.

According to the invention, therefore, by setting the temperature in the central part of the substrate higher as shown in FIG. 1, the deposition probability of the reaction products is changed in the plane of the substrate as shown in FIG. 5 and the deposition amount of the reaction products serving as the side wall protection layer is uniformized in the plane of the substrate. That is, the deposition probability of the reaction products is set to be low in the central part of the plane of the substrate and is set to be high in the peripheral part. As a result, the thickness distribution characteristic of the side wall protection layer can be uniformized in the plane of the substrate as shown in FIG. 5.

In order to obtain the characteristic to make the temperature in the central part of the substrate higher as compared with that in the peripheral part of the substrate, for example, the depth (d) of the recessed parts 34, 35, and 36 (or trenches) decreases sequentially from the central part to the outer side of the electrostatic adsorption electrode 3.

Figure 7:
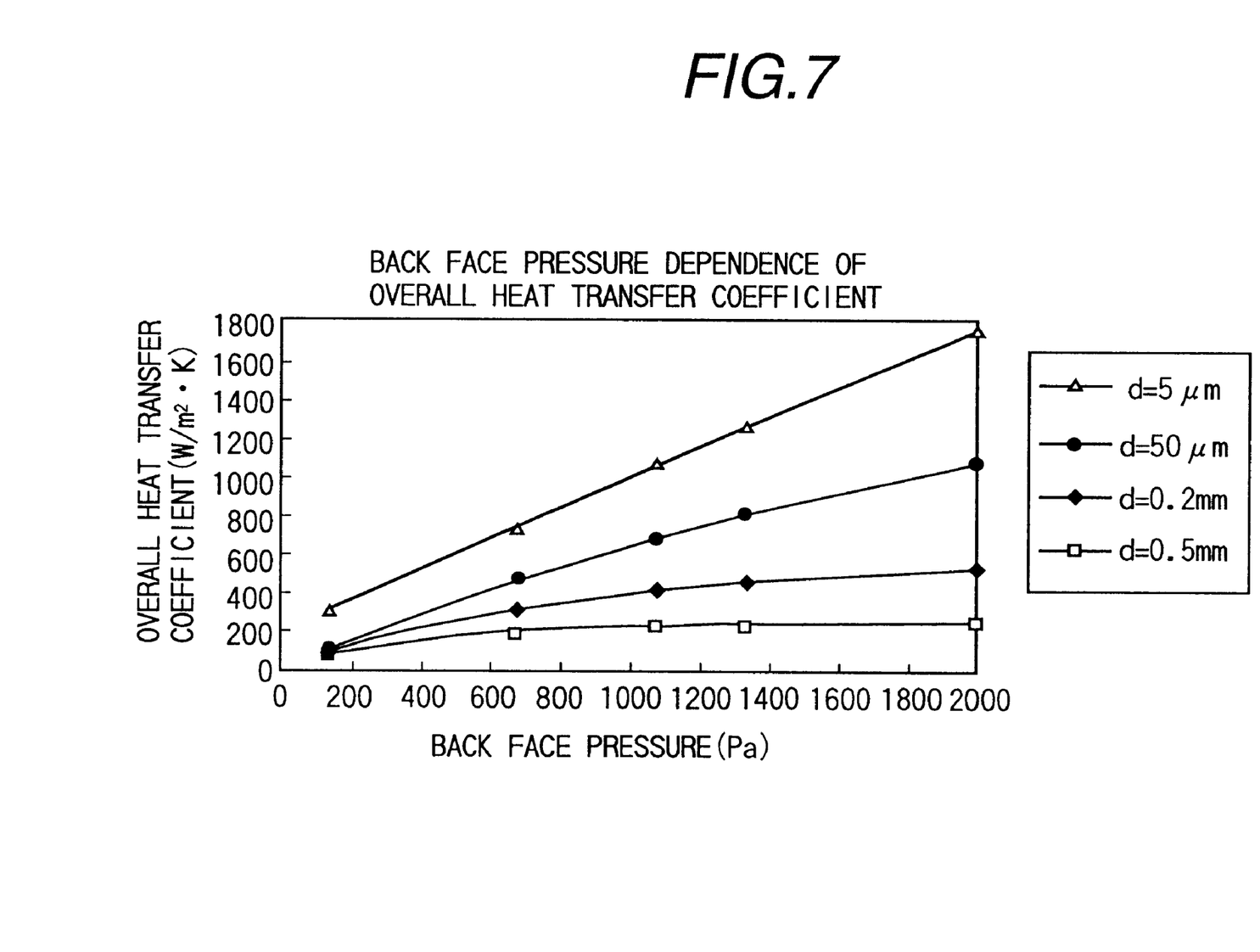
FIG. 7 is a diagram showing the relation between pressure (Pa) on the back face of the electrode and an overall heat transfer coefficient (W/m$^2$·K) by gas molecules.

FIG. 7 shows the relation between pressure (Pa) on the back face of the substrate and the overall heat transfer coefficient $(W/m^2 \cdot K)$ by the gas molecules. It will be understood from FIG. 7 that the higher the pressure on the back face is, the larger the overall heat transfer coefficient is. Consequently, the relation between the distance (d) between the back face of the substrate and the surface of the electrode and the overall heat transfer coefficient by the gas molecules when the pressure is set to be constant is obtained as shown in FIG. 8.

Figure 8:
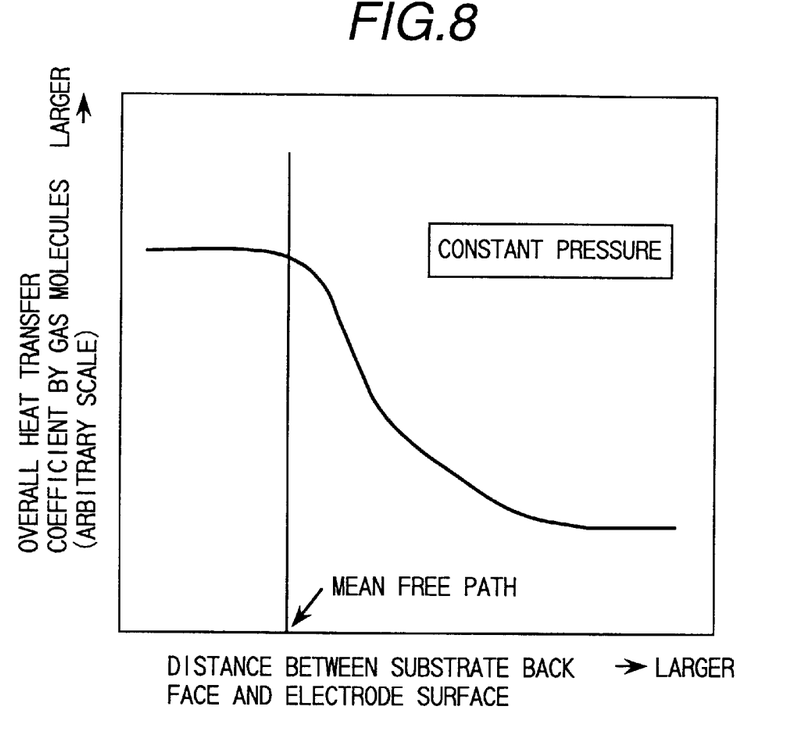
FIG. 8 is a diagram showing the relation between a distance (d) between the back face of the substrate and the surface of the electrode and the overall heat transfer coefficient by gas molecules when the pressure is constant.

Using the characteristics of FIG. 8, therefore, by setting while changing the depth (d) of the recessed parts 34, 35, and 36 (or trenches) on the surface of the electrostatic adsorption electrode from the center to the outer side, the temperature distribution as shown in FIG. 1 can be obtained.

In practice, it is sufficient to set the depth (d) of each of the recessed parts 34, 35, and 36 (or trenches) on the surface of the electrostatic adsorption electrode so that the deposition amount of the reaction products in the plane of the substrate can be maintained at the in-plane uniformity of ±10%.

The method of the invention can be especially effectively applied to a case where the diameter of the substrate is 200 mm or larger and a pattern formed on the substrate is 0.35 µm or smaller.

Figure 9:
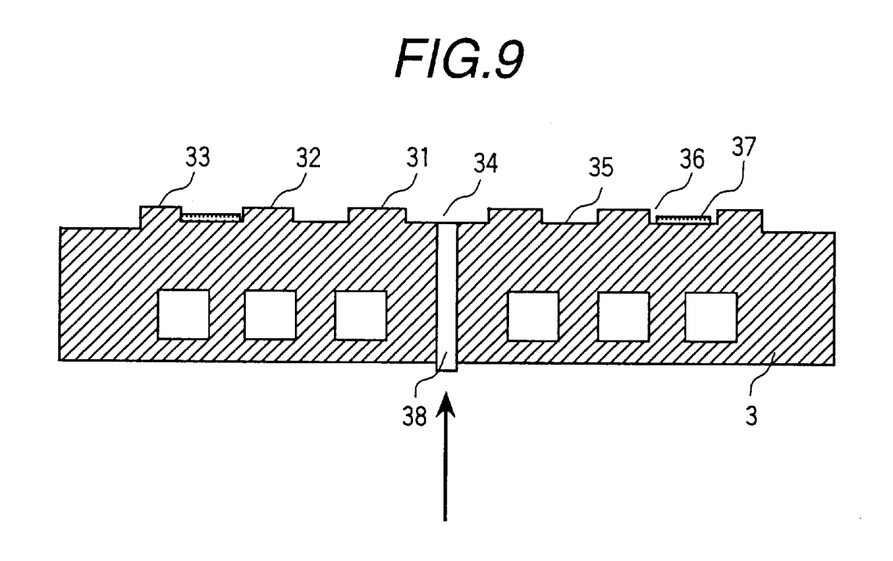
FIG. 9 is a vertical cross section of an electrode according to another embodiment of the invention.

In order to set the depth (d) of the recessed parts 34, 35, and 36 (or trenches) on the surface of the electrostatic adsorption electrode so as to be changed from the center to the outer side, as shown in FIG. 9, it is also possible to preliminarily uniform the depth of the recessed parts and to adjust the depth by arranging spacers 37 having different thickness.

Instead of changing the thickness of the spacers 37, it is also possible to change the thermal conductive characteristics by coating the gap (trench) between the electrode surface and the substrate with a polyimide film or the like, thereby obtaining a predetermined temperature distribution in the plane of the substrate. Further, the temperature can be changed according to processes by adjusting the kind or thickness of a film. By sticking the film again, cleaning can be easily done. The film does not have to be made of plastics but can be also made of a metal or ceramics.

Figure 10:
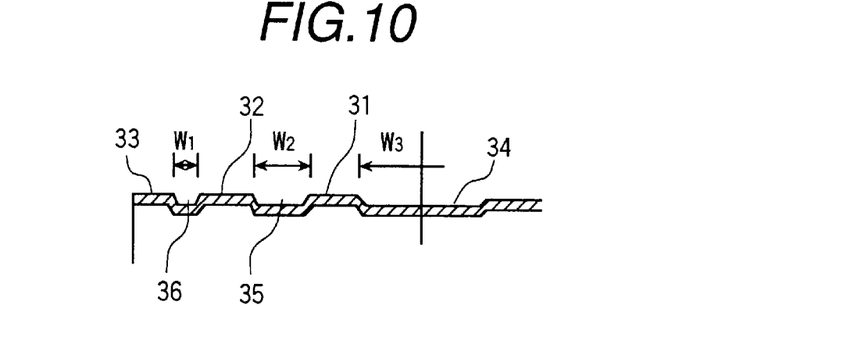
FIG. 10 is a diagram for explaining the electrode according to another embodiment of the invention.
Figure 11:
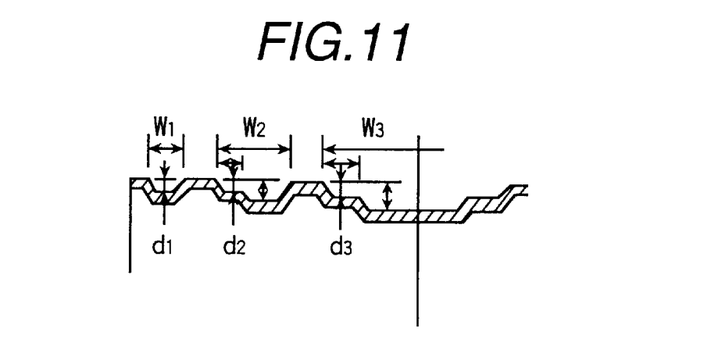
FIG. 11 is a diagram for explaining the electrode according to another embodiment of the invention.

As shown in FIG. 10, the width W (W1, W2, and W3) of the recessed parts 34, 35, and 36 (or trenches) on the surface of the electrostatic adsorption electrode is changed so as to become narrower from the center of the electrode to the outer side, thereby enabling a temperature distribution in the plane of the substrate as shown in FIG. 1 to be obtained. Further, as shown in FIG. 11, both the depth (d) (d1, d2, d3) and the width W (W1, W2, W3) of the recessed parts 34, 35, and 36 (or trenches) on the surface of the electrostatic adsorption surface are sequentially changed from the center of the electrode to the outer side, thereby enabling the temperature distribution in the substrate plane as shown in FIG. 5 to be obtained.

Figure 12:
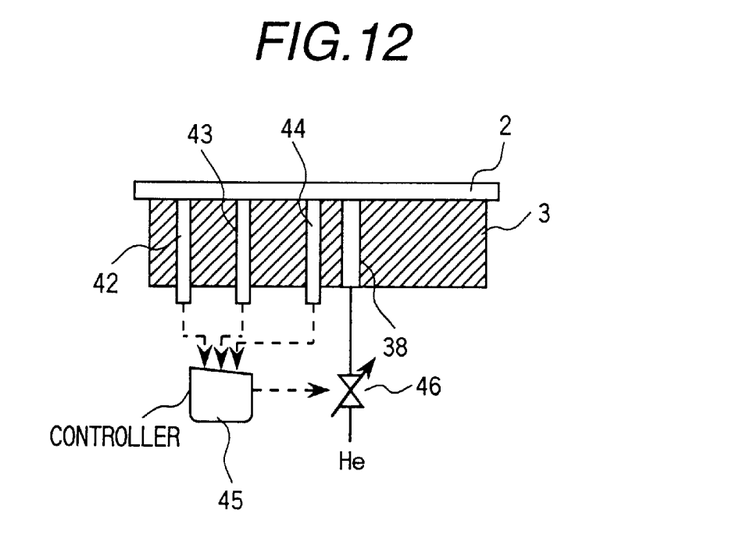
FIG. 12 is a diagram for explaining a method of controlling the temperature in the substrate plane according to another embodiment of the invention.

Another method can be also employed. As shown in FIG. 12, the temperature in the substrate 2 is measured by sensors 42, 43, and 44 and the pressure of gas for heat transfer which is supplied between the substrate 2 and the electrode 3 via the passage 38 is controlled by a valve 46 via a controller 45 on the basis of the measured temperatures, thereby enabling the temperature distribution in the plane of the substrate as shown in FIG. 1 to be also derived.

Figure 6:
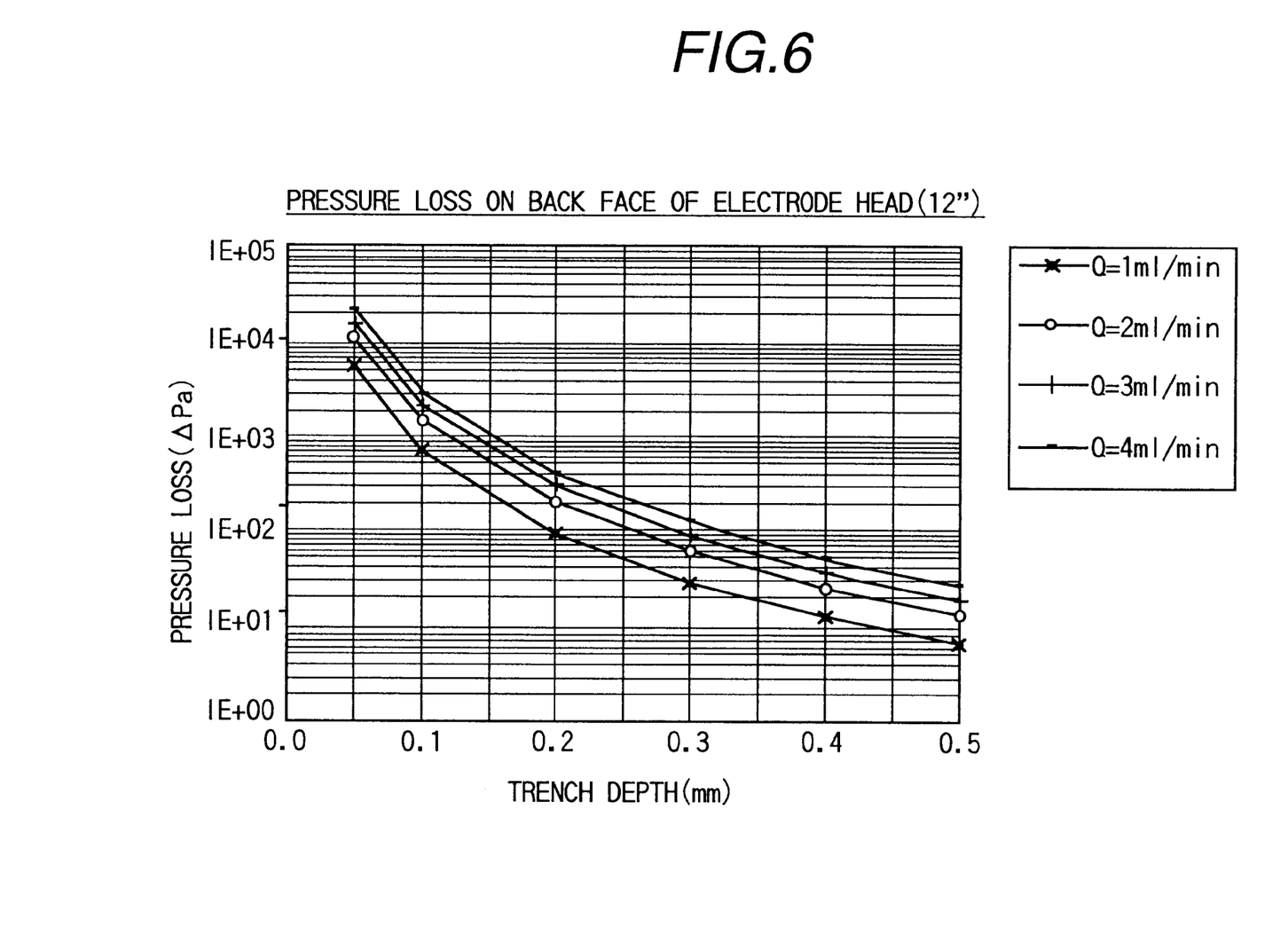
FIG. 6 is a diagram showing the relation among the depth of recessed parts (or trenches) of an electrostatic adsorption electrode and pressure loss (Pa) on the back face of the electrode.
Figure 13:
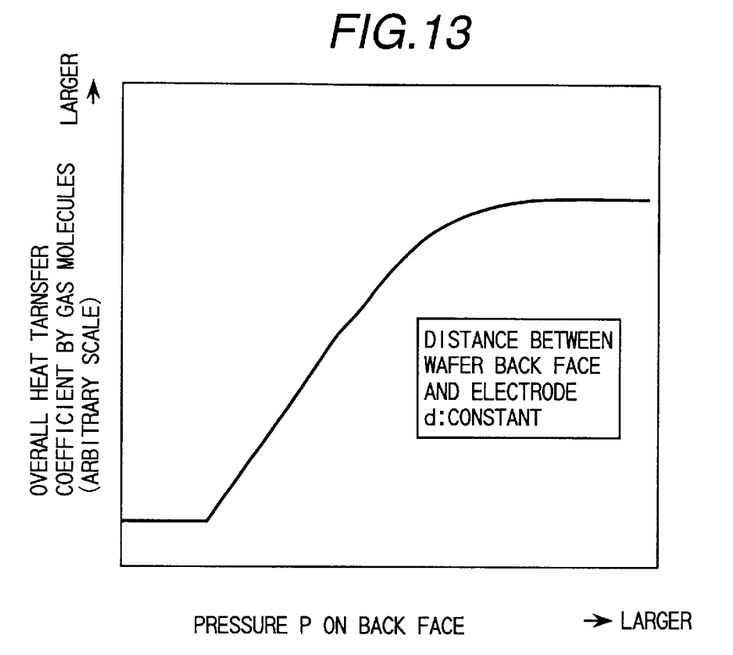
FIG. 13 is a diagram showing the relation between the pressure on the back face of the substrate and the overall heat transfer coefficient.

The pressure of the gas for heat transfer to the back face of the substrate can be increased by increasing the flow of the heat transfer gas. On the other hand, the pressure to the back face and the overall heat transfer coefficient have the relation as shown in FIG. 13. The depth of the recessed part (or trench) of the electrostatic adsorption electrode 3 and the pressure loss (Pa) on the back face of the electrode have the relation as shown in FIG. 6. It will be understood from FIG. 6 that the larger the trench depth (d) is, the smaller the pressure loss ΔPa is. Consequently, the supply pressure of the heat transfer gas is adjusted so that the pressure loss occurs due to the shapes of radial recessed parts or trenches of the electrostatic adsorption electrode 3 which communicate the recessed parts 34, 35, and 36 and the pressure of the heat transfer gas to the recessed parts 34, 35, and 36 is properly regulated, thereby enabling the temperature distribution in the substrate plane as shown in FIG. 1 to be obtained.

Independent passages for supplying the heat transfer gas can be also provided for the respective recessed parts 34, 35, and 36 so that the pressures of the heat transfer gas supplied to the recessed parts 34, 35, and 36 can be adjusted respectively.

Figure 14:
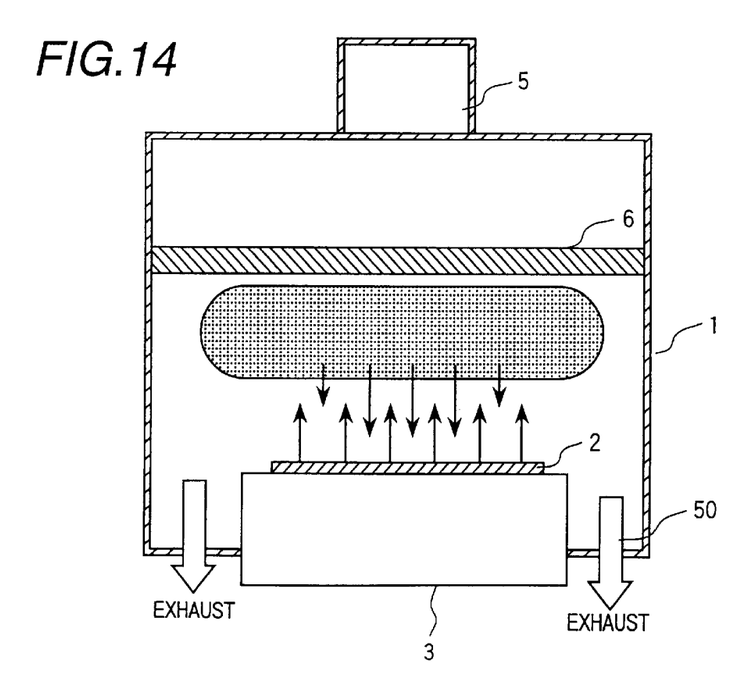
FIG. 14 is a diagram for explaining an etching treatment method according to another embodiment of the invention.

Further, as another embodiment of the invention, as shown in FIG. 14, by etching the substrate 2 while regulating the exhaust amount of the reaction products from the etching chamber 1 by exhaust means 50, the deposition amount of the reaction products can be made uniform in the substrate plane.

A method of adjusting a process gas in order to uniformize the deposition amount of the reaction products in the substrate plane during the etching will now be described. That is, the process gas is adjusted by changing the parameters in the range and the manner described below.

(1) kinds of gasses: $BCl_3$, $Cl_2$ addition gases: $CHF_3$, $CF_4$, $CH_2F_2$, $Ar+CH_4$ (2) gas flow rate $BCl_3$; 10 ml/min to 100 ml/min $Cl_2$; 50 ml/min to 400 ml/min (3) gas pressure: 0.1 Pa to 6 Pa (4) microwave (2.45 GHz) output: 200 W to 2000 W (5) RF output: 10 W to 500 W (frequency to be used: 100 KHz to 13.56 MHz)

(6) substrate temperature range: 50° C. to 100° C.

(7) resist is used as a mask

Within the above parameter adjustment range, in order to reduce the difference (the density in the center of the substrate is high and that in the peripheral part is low) in density distribution of the reaction products in the plane, the following methods can be used.

(1) reduction in the gas pressure (0.1 Pa to 1 Pa)

The gas pressure is lowered, the gas residence time is shortened, and the volatility of the products is increased, thereby reducing the number of re-deposition times of the reaction products after etching. In such a state, since the number of collisions with other gas molecules is small in both the center and the peripheral part of the substrate until the reaction products are exhausted, a difference does not easily occur between the exhaust speed in the center of the substrate and that in the peripheral part. Consequently, the variation in the deposition amount distribution of the reaction products in the plane of the substrate is reduced.

(2) increase in both the gas flow rate and the chlorine flow ratio (>80%)

By shortening the gas residence time by the increase in flow rate, the volatility of the products is increased and the number of deposition times of the reaction products after etching is reduced.

By reducing $BCl_3$ ions having a large mass, the amount of deposition on the side walls from the resist by the ion attack is decreased, thereby reducing the variation in the in-plane reaction product deposition density distribution.

(3) increase in the whole substrate temperature (70° C. to 100° C.)

By increasing the temperature of the whole substrate, the number of re-deposition times can be reduced.

Although the increase itself in the substrate temperature does not directly contribute to solve in-plane variation, when the temperature in the substrate is controlled, for example, when the substrate temperature is increased, the probability of deposition of the irradiated reaction products decreases. Consequently, the deposition amount itself of the in-plane reaction products is reduced, so that the absolute value of the variation in the deposition density distribution of the reaction products in the substrate plane can be reduced.

(4) reduction in the plasma density (decrease in the microwave output)

By lowering the density of the plasma, the amount of reaction products is suppressed and the variation in the in-plane reaction product deposition density distribution is reduced.

(5) reduction in the energy of ions directed at the substrate (decrease in the RF output)

By decreasing the RF output, the amount of the deposition on the side walls from the resist by the ion attack is reduced and the variation in the in-plane reaction product deposition density distribution is reduced.

By optimizing the parameters so as to be applied to various areas to be etched, preferably, to a wiring process of a semiconductor in which the diameter of the substrate is 200 mm or larger and a pattern formed on the substrate is 0.35 $\mu$m or smaller, etching which does not cause a variation in the processing dimension in the plane of the substrate can be performed.

Also in so-called dense and sparse patterns in which fine patterns and sparse patterns which are not so fine mixedly exist in almost the same place on the substrate, the variation in the processing dimension can be reduced. That is, the finer the pattern becomes, the more the incident particles enter deep inside the pattern and the probability of deposition on the side walls is reduced, so that the side wall protection layer becomes thinner. According to the invention, however, the uniformity in the dense and sparse patterns can be also achieved by a reason similar to that of the uniformization of the side wall protection layer in the plane of the substrate.

As mentioned above, according to the invention, the plasma treatment method and apparatus in which the influence exerted on the etching characteristics of the reaction products in the plasma treatment is offset and the uniform treatment characteristics in the substrate plane are obtained can be provided.

According to the invention, the in-plane distribution of the plasma treatment characteristics can be uniformized by a simple method, for instance, of changing the temperature in the substrate plane, so that an effect that the yield of devices is improved can be produced. Since the substrate temperature can be changed according to the process, there is also an advantage that the invention is applicable to various specifications in the treatment of etching or the like.

According to the invention, further, the plasma treatment method and the plasma treatment apparatus which can obtain the etching treatment characteristics causing no variation in the processing dimension in the dense and sparse patterns can be provided.

What is claimed is:

1. A plasma treatment method of treating a substrate to be processed by using a gas plasma via a mask in a treatment chamber, comprising the steps of:

forming a side wall protection layer on side walls of said treated part of said substrate while treating said substrate to be processed using said gas plasma; and controlling a temperature distribution in a plane of the substrate so as to equalize a deposition amount of said side wall protection layer formed on said side walls of said treated part of said substrate to be processed in the center and in an end part of the substrate to be processed by increasing a temperature of a portion of the substrate at which the deposition amount of the side wall protection layer is large, and maintaining the in-plane uniformity of said side wall protection layer.

2. A method according to claim 1, wherein the plasma treatment is performed on said substrate to be processed while adjusting a pressure, a flow rate, and a mixing ratio of a process gas in said treatment chamber.

3. A method according to claim 1, wherein the plasma treatment is performed on said substrate to be processed while regulating an exhaust amount of reaction products from said treatment chamber.

4. A method according to claim 1, wherein the plasma treatment is performed on said substrate to be processed while adjusting at least one of the kind of said process gas and the pressure of the process gas in the treatment chamber.

5. A method according to claim 4, wherein plasma treatment is performed on said substrate to be processed while measuring the temperature of said substrate to be processed and controlling the pressure of a heat transfer gas supplied between said substrate to be processed and a substrate holding electrode on the basis of said temperature.

6. A plasma treatment method of performing plasma treatment on a substrate to be processed with a gas plasma by using a resist as a mask in a treatment chamber, comprising the steps of:

forming a side wall protection layer on side walls of said treated part of said substrate while treating said substrate to be processed using said gas plasma; and controlling a temperature distribution in a plane of said substrate to be processed so as to maintain the in-plane uniformity of said side wall protection layer formed on said side walls of said treated part of said substrate to be processed by increasing a temperature of a portion of said substrate at which a deposition amount of said side wall protection layer is large.

7. A method according to claim 6, wherein the plasma treatment is performed on said substrate to be processed while maintaining the temperature in the central part of said substrate to be processed higher than that in a peripheral part thereof by changing thermal conduction characteristics by coating a gap between said substrate and an electrode on which said substrate is held with a polyimide film or the like.

8. A method according to claim 4, wherein the plasma treatment is performed on said substrate to be processed while maintaining the temperature in the central part of said substrate to be processed higher than that in a peripheral part thereof.

9. A method according to claim 4, wherein an electrode on which said substrate is placed is an electrostatic adsorption electrode, a part of the surface of said electrode is an electrostatic adsorption face to be in contact with the back face of said substrate, and the plasma treatment is performed to said substrate on be processed while adjusting an electrostatic adsorption power both in the center part and the peripheral part in the plane of said electrode.

10. A method according to any one of claims 1 and 4 to 11, wherein variation in a deposition amount of reaction products in the plane of said substrate to be processed is maintained within ±10%.

11. A method according to any one of claims 1 and 4 to 11, wherein the diameter of said substrate to be processed is 200 mm or larger and a pattern formed on said substrate to be processed is 0.35 mm or smaller.

12. A plasma treatment method in a processing chamber for processing a substrate accommodated therein using a plasma via a mask, wherein said plasma treatment forms a side wall protection layer on side walls of an etched part of said substrate to be processed while effecting etching treatment, and a temperature of a center region of the substrate under processing is controlled to be higher than a peripheral region so as to make a deposition efficiency of a reaction product onto said side walls of said etched part of the substrate under processing low in the center region and thereby maintaining even a deposition amount in said side wall protection layer produced on said side walls of said etched part of the substrate under processing during the processing over the center and peripheral regions of the substrate so as to provide a unified thickness of side wall protection layers thereon.

13. A plasma treatment method according to claim 12, wherein the substrate is retained on an electrode, a heat transferring gas is supplied into a space between the substrate and the electrode, a pressure of the heat transferring gas is controlled based on a temperature measured at least two points in a direction of a radius of the substrate, and a temperature distribution on a surface of the substrate is controlled using pressure loss at a concave portion provided on a mounting surface of the substrate.

14. A plasma treatment method in a processing chamber for processing a substrate accommodating therein with a plasma using a resist as a mask, wherein said plasma treatment forms a side wall protection layer on side walls of a treated part of said substrate while treating said substrate to be processed using said gas plasma; and an entire body of the substrate under processing is controlled at a high temperature so as to make a re-deposition efficiency of a reaction product onto a center of the substrate under processing low, and maintaining uniformity of side wall protection layers produced on said side walls of said treated part of the substrate while processing.

15. A plasma treatment method in a processing chamber for processing a substrate accommodated therein with a plasma using a resist as a mask, comprising the steps of:

forming a side wall protection layer on side walls of said treated part of said substrate while treating said substrate to be processed using said gas plasma; and controlling temperature of a center region of the substrate under processing to be higher than a temperature of a peripheral region so as to maintain uniformity of side wall protection layers produced on said side walls of said etched part of the substrate while processing.

16. A plasma treatment method according to claim 15, wherein the temperature of the substrate under processing is controlled by flowing a heat transferring gas onto a backside of the substrate so that a heat transfer rate between the substrate and a retaining electrode for the substrate is made smaller in the center region of the substrate than the heat transfer rate in the peripheral region.

17. A plasma treatment method according to claim 15, wherein the substrate under processing is retained by the retaining electrode utilizing electrostatic adsorption, and a heat transfer rate in the center region of the substrate is made small by flowing a heat transferring gas onto a backside of the substrate.

18. A plasma treatment method in a processing chamber for processing a substrate accommodated therein with a plasma gas using a resist as a mask, wherein a retaining electrode for the substrate is an electrostatic adsorption electrode, the electrostatic adsorption electrode having a portion with a surface formed as an electrostatic adsorbing surface which contacts a backside of the substrate with adsorbing forces regulating separately for center and peripheral regions of the substrate so as to control a temperature distribution in a plane of the substrate, whereby uniformity of side wall protection layers formed on the substrate is maintained while processing.

19. A plasma treatment method in a processing chamber for processing a substrate accommodated with a plasma gas using a resist as a mask, wherein one of a polyimide film and an other film similar to the polyimide film is inset in a gap between the substrate and a retaining electrode for the substrate so as to vary thermal conduction characteristics across the gap and to control the temperature distribution in a plane of the substrate so as to maintain temperature in a center region of the substrate higher than a temperature in a peripheral region thereof, thereby maintaining uniformity of side wall protection layers formed on the substrate while processing.

\* \* \* \* \*